(12) United States Patent
Chinthakindi et al.

(10) Patent No.: US 7,768,055 B2
(45) Date of Patent: Aug. 3, 2010

(54) PASSIVE COMPONENTS IN THE BACK END OF INTEGRATED CIRCUITS

(75) Inventors: Anil K. Chinthakindi, Poughkeepsie, NY (US); Douglas D. Coolbaugh, Essex Junction, VT (US); Ebenezer E. Eshun, Essex Junction, VT (US); Zhong-Xiang He, Essex Junction, VT (US); Jeffrey B. Johnson, Essex Junction, VT (US); Jonghae Kim, Fishkill, NY (US); Jean-Oliver Plouchart, New York, NY (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 137 days.

(21) Appl. No.: 11/164,634

(22) Filed: Nov. 30, 2005

(65) Prior Publication Data

US 2007/0123015 A1    May 31, 2007

(51) Int. Cl.
*H01L 29/94* (2006.01)
(52) U.S. Cl. .............................. 257/307; 257/E27.089
(58) Field of Classification Search .................. 257/516
See application file for complete search history.

(56) References Cited

U.S. PATENT DOCUMENTS

| | | | |
|---|---|---|---|
| 3,862,017 A | 1/1975 | Tsunemitsu | |
| 4,490,429 A * | 12/1984 | Tosaki et al. | 428/195.1 |
| 4,961,104 A | 10/1990 | Hirakawa | |
| 5,275,963 A | 1/1994 | Cederbaum | |
| 5,298,782 A | 3/1994 | Sundaresan | |
| 5,707,881 A * | 1/1998 | Lum | 438/15 |
| 6,022,766 A * | 2/2000 | Chen et al. | 438/152 |
| 6,351,391 B1 * | 2/2002 | Beliveau et al. | 361/767 |
| 6,445,056 B2 * | 9/2002 | Nakashima | 257/532 |
| 6,458,670 B2 * | 10/2002 | Nagasaka | 438/382 |
| 6,500,724 B1 | 12/2002 | Zurcher | |
| 6,700,203 B1 | 3/2004 | Cabral, Jr. | |
| 6,784,091 B1 * | 8/2004 | Nuetzel et al. | 438/618 |
| 7,557,426 B2 * | 7/2009 | Baumgartner et al. | 257/532 |
| 2002/0038903 A1 * | 4/2002 | Tsau | 257/532 |
| 2004/0253783 A1 * | 12/2004 | Egashira et al. | 438/232 |
| 2006/0261462 A1 * | 11/2006 | Lai et al. | 257/698 |
| 2007/0115018 A1 * | 5/2007 | Chanda et al. | 324/765 |
| 2009/0039465 A1 * | 2/2009 | Chinthakindi et al. | 257/532 |

* cited by examiner

*Primary Examiner*—Minhloan Tran
*Assistant Examiner*—Benjamin P Sandvik
(74) *Attorney, Agent, or Firm*—Anthony J. Canale

(57) ABSTRACT

Passive components are formed in the back end by using the same deposition process and materials as in the rest of the back end. Resistors are formed by connecting in series individual structures on the nth, (n+1)th, etc levels of the back end. Capacitors are formed by constructing a set of vertical capacitor plates from a plurality of levels in the back end, the plates being formed by connecting electrodes on two or more levels of the back end by vertical connection members.

7 Claims, 5 Drawing Sheets

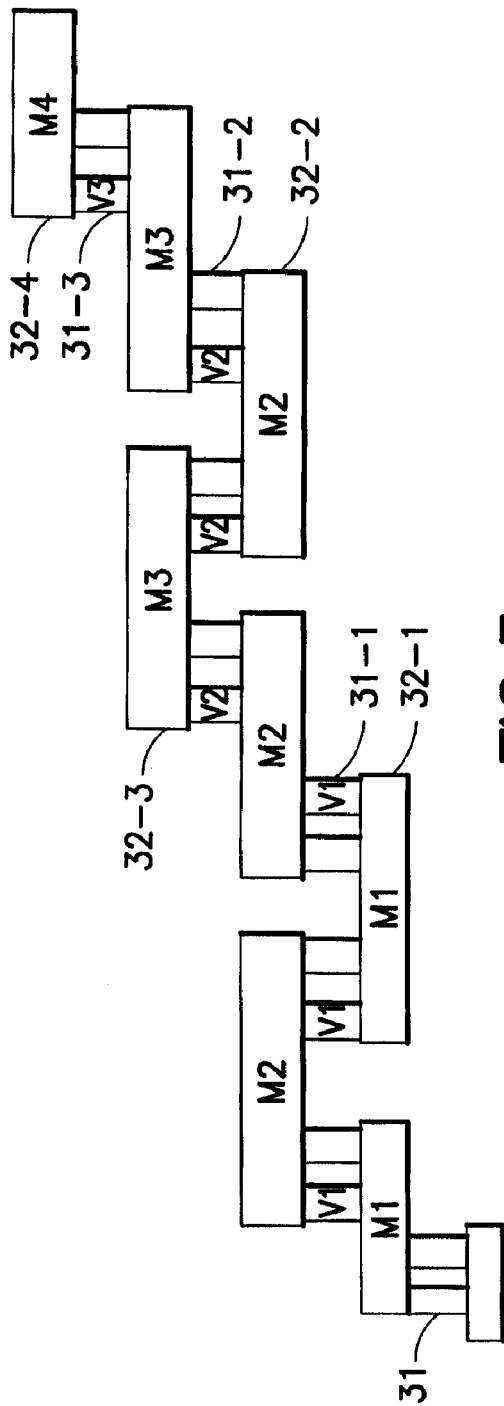
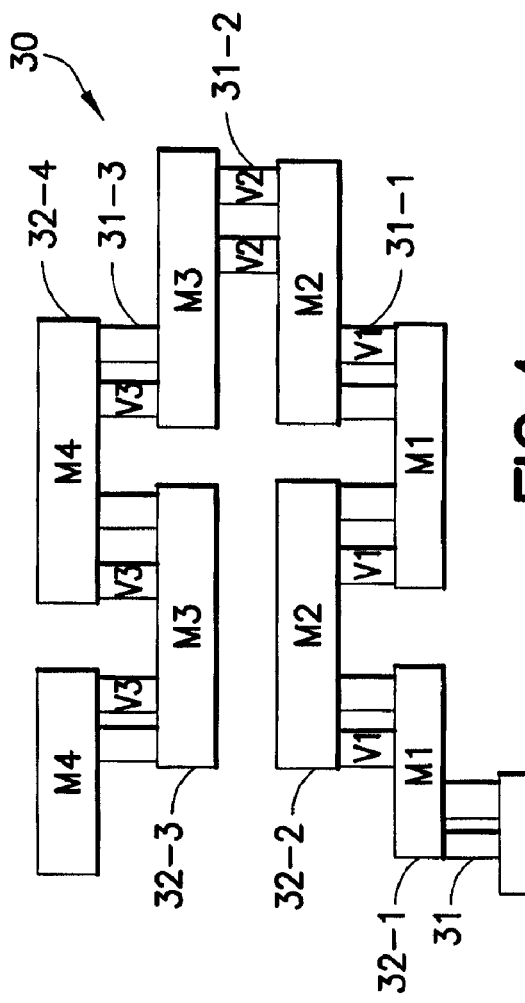
FIG.3
FIG.4

PASSIVE COMPONENTS IN THE BACK END OF INTEGRATED CIRCUITS

TECHNICAL FIELD

The field of the invention is that of forming passive components in the back end of the line wiring of an integrated circuit.

BACKGROUND OF THE INVENTION

Conventionally, the formation of passive components, e.g. resistors and capacitors, in the back end employs one or more photolithographic masks to define the deposition of a high-resistance material in the case of resistors and the deposition of a pair of planar electrodes with a dielectric between in the case of a capacitor.

In the case of resistors, the material has a high resistivity compared with the Al or Cu of the interconnect material and therefore requires a separate deposition step and a special mask different from the mask of the nth wiring level. In the case of capacitors, there will be separate deposition steps for horizontal planar electrodes and for the dielectric between the electrodes.

Structures like these perform well enough, but the requirement of one or more additional masks means that the use of such structures incurs additional costs to have the masks made, plus yield detractors associated with the additional handling and processing steps.

The art could benefit from a method of forming passive components that does not require additional masks and/or processing steps.

SUMMARY OF THE INVENTION

The invention relates to a method of forming passive components in the back end that does not require the use of an additional mask.

A feature of the invention is that the structure is formed by combining wires and vias defined by the same masks used for interconnections in the back end.

Another feature of the invention is that structures on different levels of interconnection are combined so as to reduce variability in the value of the resistance or capacitance of the device being formed.

BRIEF DESCRIPTION OF THE DRAWINGS

FIG. 3 shows a side view of an alternative embodiment of a resistor.

FIG. 4 shows another side view of an alternative embodiment of a resistor.

DETAILED DESCRIPTION

Figure 1:
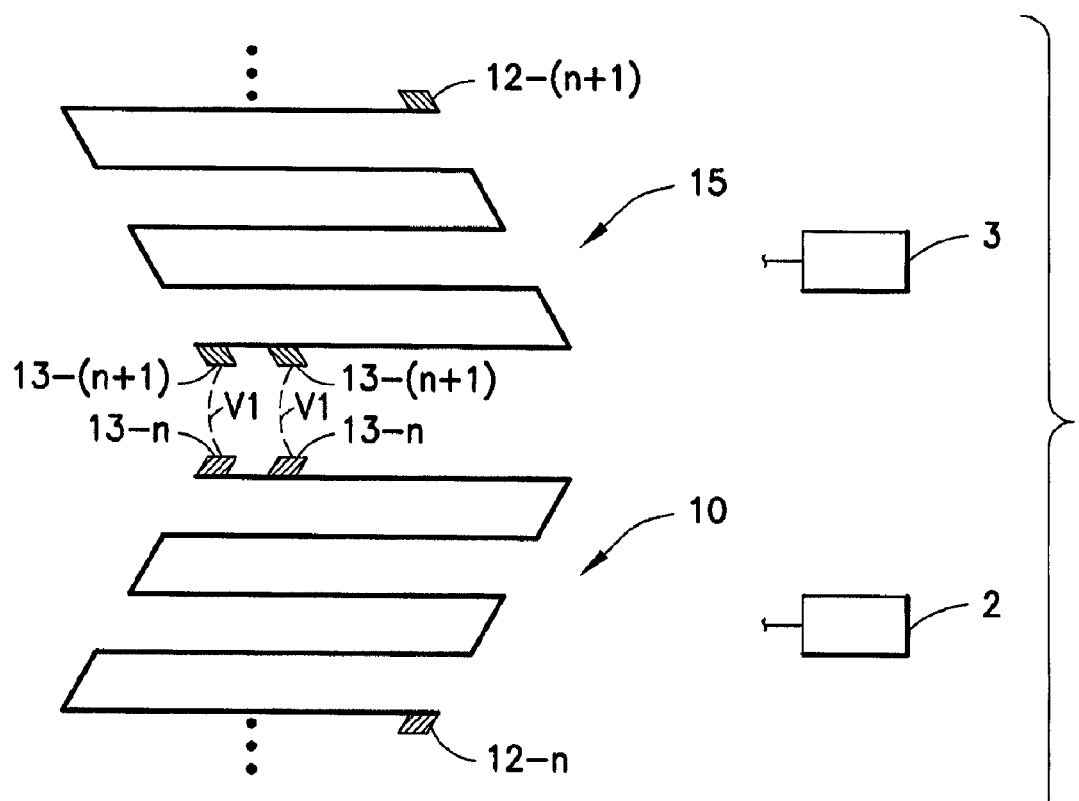
FIG. 1 shows an exploded view of a first embodiment of a resistor.

Passive Resistors:

FIG. 1 shows in an exploded view a portion of a resistor formed according to the invention, in which a first resistive element 10 formed on the nth metal level and a second resistive element 15 formed on the (n+1)th metal level are connected in series through one or more vias, e.g. two vias, v1 filled with a conductor and connecting contacts 13-n on the nth level and a corresponding contact on the (n+1)th level, 13-(n+1). The two vias are denoted with dashed lines. Further connections are provided at contacts 12-n, connecting to resistive elements in layers below those shown and contact 12-(n+1) connecting to resistive elements in layers above those shown.

Box 3 on the right represents schematically other interconnections on the (n+1)th level in other parts of the circuit being constructed. Box 2 also represents schematically other interconnections on the nth level in other parts of the circuit being constructed.

Each resistive element in FIG. 1 is formed in a serpentine shape from the same material, e.g. Cu or AlCu lined with thin refractory metal or refractory metal alloys, as known in the art, as is used to form the interconnects on that wiring level. That is, the same mask is used to pattern simultaneously the interlevel dielectric (e.g. to form a damascene structure and the damascene apertures for the resistive element) and corresponding structures for the interconnect. Alternatively, if subtractive-etch wiring, e.g. AlCu wiring, is used, then the same mask is used to pattern the AlCu wires and the resistive element wires.

The example in FIG. 1 shows only two levels for convenience in illustration, but any desired number of levels can be used to form the passive elements.

The designer of the product containing the structure (e.g. an integrated circuit) will decide what will be the cross section of the resistive element. In a preferred embodiment, a cross section for the wire in the resistive element is greater than 1× (e.g. 1.4) and in a range of greater than 1× to 2× the corresponding minimum cross section width of the regular interconnect. This counterintuitive result, since the resistance will thereby be lowered, results from a desire to reduce variability of the total resistance of the final structure. The wire resistance variability is determined by the variation in width, height, and conductor resistivity. For minimum width wires, the variability is typically dominated by the wire width variation. Thus, for example, a 200 nm wide wire will have 40% less resistance variability than a 100 nm wide wire. In addition, more than one via is preferably used in a parallel connection as shown in FIG. 1 to connect layers (resistive elements) of the structure. Duplication of vias will reduce the total resistance, but will also reduce via resistance variability and increase reliability.

Figure 2:
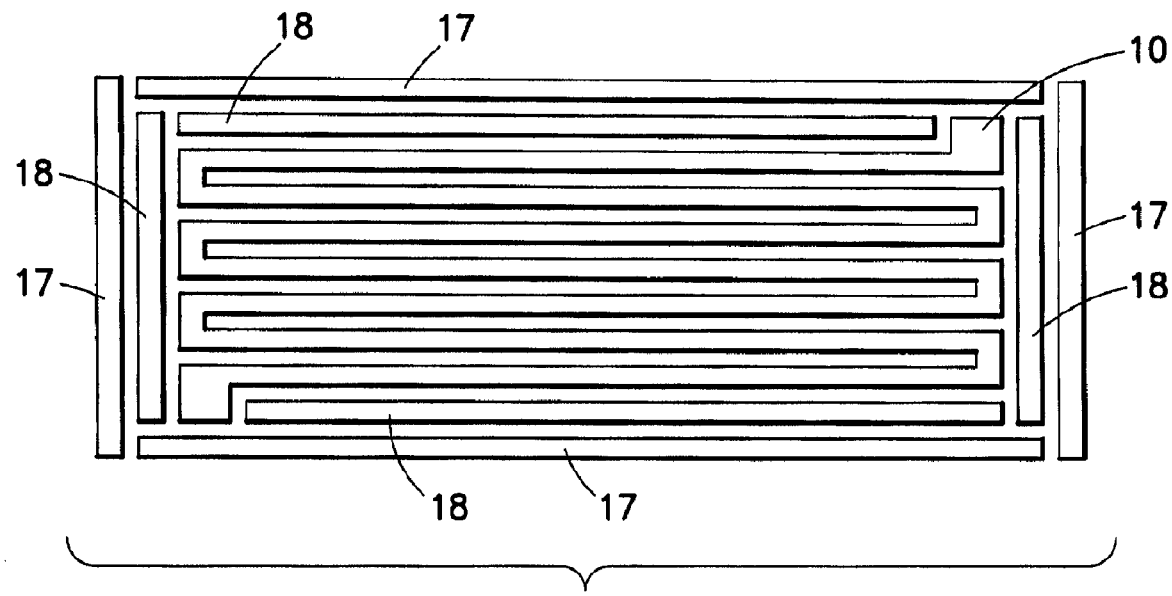
FIG. 2 shows a top view of an alternative embodiment of a resistor.

FIG. 2 shows a serpentine 10 as in FIG. 1, with a set of protective buffer structures 17 and 18. These structures are damascene trenches containing the same metal as the serpentine 10. The function of the buffer structures is to reduce wire width and height variability induced by lithography, etching, and chemical-mechanical polishing (CMP) of the serpentine. During photolithography, due to light scattering effects, the wires at the edge of an array tend to print larger or smaller than wires in the array and thus have more width variability. During etching, due to RIE loading effects, wires at the edge of nested arrays have increased width and, for damascene wires, height variability. During CMP, wires at the edge of nested arrays have increased height variability, due to surface erosion variability induced by the dielectric adjacent to the wires.

Thus, the buffer structures 17 and 18 help to protect the edges of serpentine 10, thereby reducing resistance variability.

Table I shows measured wire resistance variability (the range from $5^{th}$ to $95^{th}$ percentile, measured on both 200 mm and 300 mm wafers with approximately 20 sites per wafer measured) for various wire serpentine structures. For the 130 nm generation fluorinated $SiO_2$ (FSG) dielectric, the measured wire resistance variability decreased substantially as the wire width increased from 200 nm to 3 um. For all structures, wiring generations, and dielectrics, the measured wire variability decreased as the number of wiring levels used increased from 1 to 2 to 3.

TABLE I

Variability of Resistance vs. the Number of Levels

| Technology | 1 level | 2 levels | 3 levels |
| --- | --- | --- | --- |
| 200 mm wafer 130 nm generation FSG dielectric w = 200 nm | 22.2% | 19.7 | 17.6 |
| 200 mm wafer 130 nm FSG w = 3 micron | 17.4 | 13.0 | 13.0 |
| 300 mm wafer 90 nm FSG w = 140 nm | 24.5 | 22.4 | 20.4 |
| 300 mm wafer 90 nm SICOH w - 140 nm | 25.8 | 22.0 | 22.0 |

FIG. 3 shows a cross section of an alternative embodiment of a resistor. A connection is made from the bottom through via 31 to a segment (resistive element) of metal 1, labeled 31-1. Illustratively, the length of metal 31-1 (and other resistive elements) is below the critical length required for Cu or AlCu electromigration to occur (e.g. on the order of 1-20 microns) to take advantage of the short length effect that reduces the effect of electromigration in metal under electrical stress. Similar resistive elements on level 2, 32-2, level 3, 32-3, and level 4, 32-4, are connected. Duplicate vias 31-1, 31-2 and 31-3 provide reduced variability as in the previous embodiment. The segments are shown as straight lines, but may be a serpentine as in FIGS. 1 and 2 or any other desired shape.

FIG. 4 shows a folded version of the embodiment of FIG. 3, with the level 3 resistive elements being located above the level 2 elements. This embodiment provides a more compact arrangement, with savings in area; and reduces the resistance variability because multiple wiring levels are used.

Passive Capacitors:

On chip capacitors can be formed using the self or natural capacitance of the BEOL wires (J. Kim et al., IEEE 2003 Symp. on VLSI Circuits, p29). By employing methods similar to those discussed supra for resistors, the vertical natural capacitor (VNC) capacitance can be increased, the capacitance variability can be decreased, and the reliability, as measured by ramping the voltage until the capacitor fails, performing time dependent dielectric breakdown stressing (TDDB), or calculating the yield to a specific leakage current criteria, can be improved.

Figure 5:
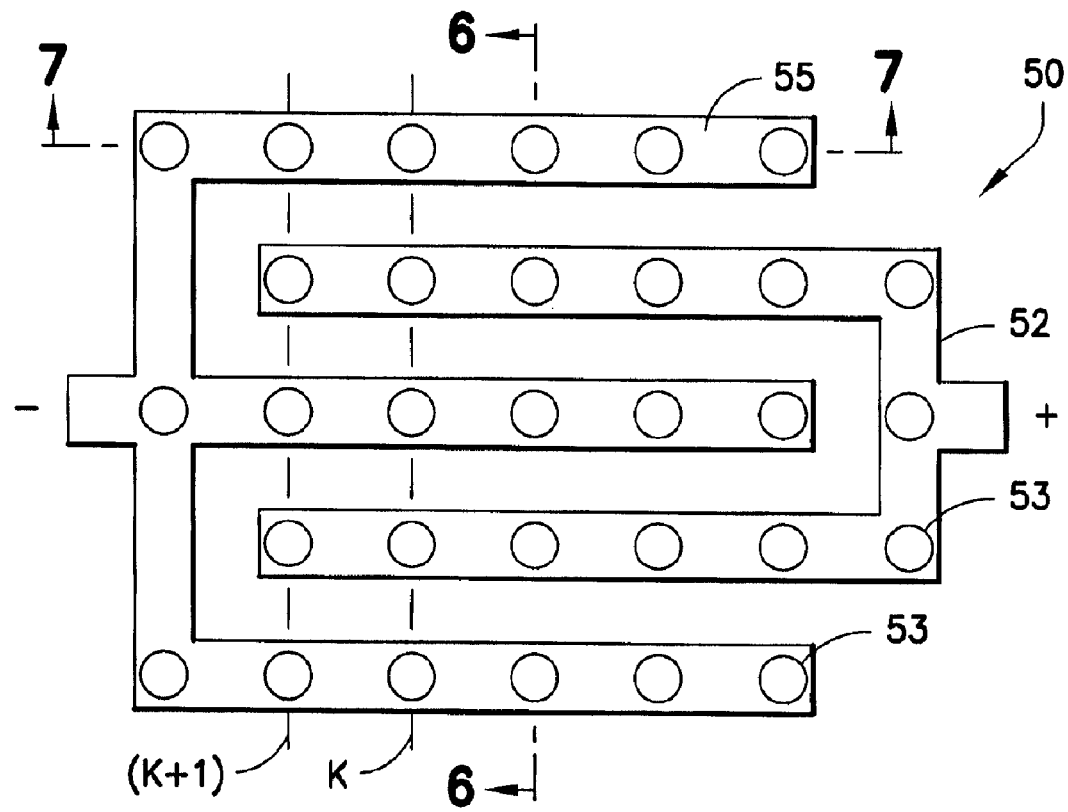
FIG. 5 shows a top view of an embodiment of a capacitor.

One method of increasing the capacitance density of VNC capacitors is to include vias between the interpenetrating comb structures. FIG. 5 shows a top view of an embodiment of a capacitor 50 according to the invention, in which the capacitor structure consists of two interdigitated electrodes 55 and 52, illustratively formed by a damascene process in an interlevel dielectric. Arrows 6-6 and 7-7 denote the locations of cross sections shown in FIG. 6 and FIG. 7, respectively. The capacitor comprises a set of several levels of electrodes tied together with vertical connectors 53 placed in vias. In this example, the vias for the two electrodes are aligned with one another, i.e. both electrode 55 and electrode 52 have vias in adjacent rows k and k+1. The space in FIG. 5 between electrodes 55 and 52 is illustratively the minimum permitted by the ground rules. In addition, the width of the conductive material in the finger electrodes is greater than the minimum width, in order to reduce variability and permit the fabrication of borders on the vias. The borders are denoted with bracket 54 in FIG. 6. These borders, fabricated conventionally, serve to reduce the risk of shorts between vias. For example, if the minimum wire width and space is 100 nm, then a 100 nm space between wires could be used and a 140 nm wire width could be used, This would result in a 20 nm per edge border on the vias, which would reduce the chance of a misaligned via or overwidth via shorting to the adjacent wire or via.

Figure 6:
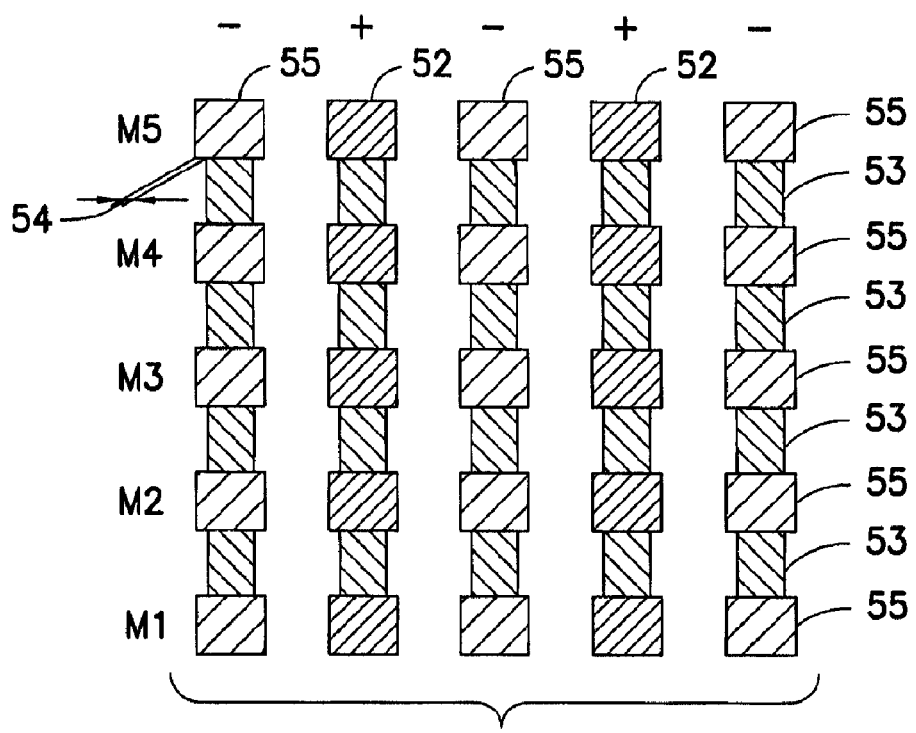
FIG. 6 shows a cross section of the capacitor of FIG. 5.

FIG. 6 shows a cross section along line 6-6 in FIG. 5, with five levels of electrodes 55 and 52 tied together with connectors 53. Both the damascene electrodes and the vertical connectors will contribute to the capacitance of the structure.

Figure 7:
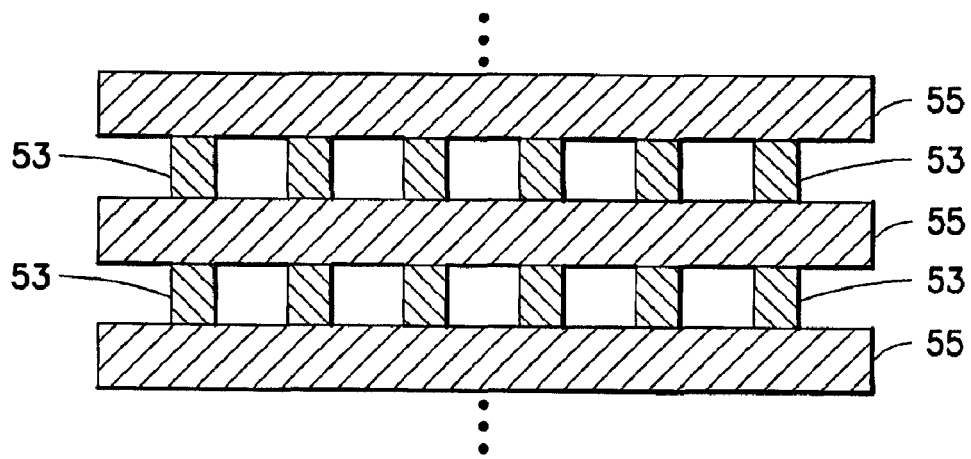
FIG. 7 shows another cross section along a perpendicular direction.

FIG. 7 shows a cross section through line 7-7, showing a portion of the structure. The result is an effective vertical capacitor plate formed from the finger electrodes of the electrodes and the vias. It can be seen that in this example, the vias will contribute to the capacitance in this version, since they are aligned (as shown in FIG. 5) opposite one another.

Figure 9A:
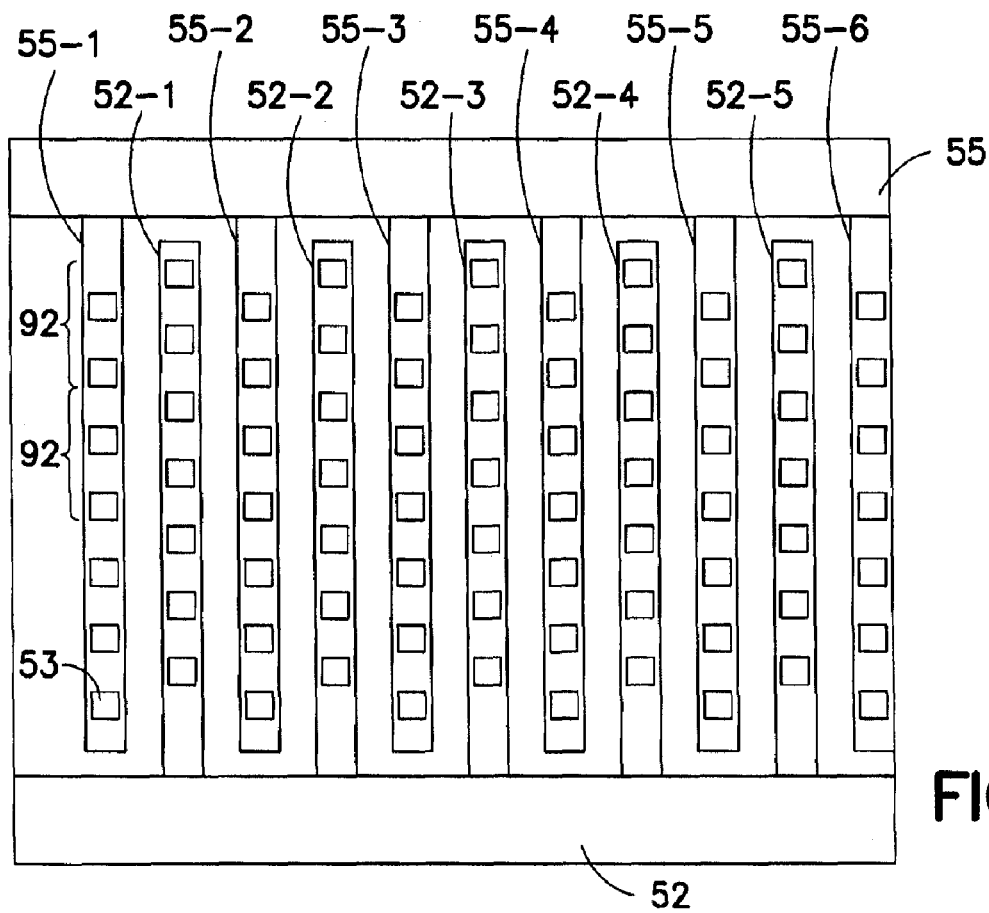
FIGS. 9a and 9B show top views of an alternative embodiment

Table II shows the effect of decreasing the transverse dimension of vias in a structure such as that shown in FIG. 6, in which solid finger electrodes of metal, deposited with the same mask as other interconnect structures on that metal level, are connected vertically by metal connections with spaces between the vertical connectors, so that the vertical structure is not solid. Adding minimum spaced (dense) vias increases the capacitance density by 20%, as expected due to increased electric field coupling between the VNC plates due to the addition of vias. To improve the yield and reliability of this VNC structure, it is desirable to decrease the via density by staggering the vias, as shown in FIG. 9A (top view). In this case, the via spacing is increased from 1.0× the via width to 3.0× the via width; and the vias are centered to maximize the space between vias on different plates of the VNC capacitor. As shown in Table II, reducing the via density by staggering them only decreases the capacitance density by ~1%, because a high enough via density is still present.

TABLE II

| Structure | Normalized Capacitance Density |
| --- | --- |
| No vias, minimum pitch | 1 |
| Bordered Dense Vias (larger pitch) | 1.20 |
| Bordered staggered dense vias | 1.19 |

Figure 8:
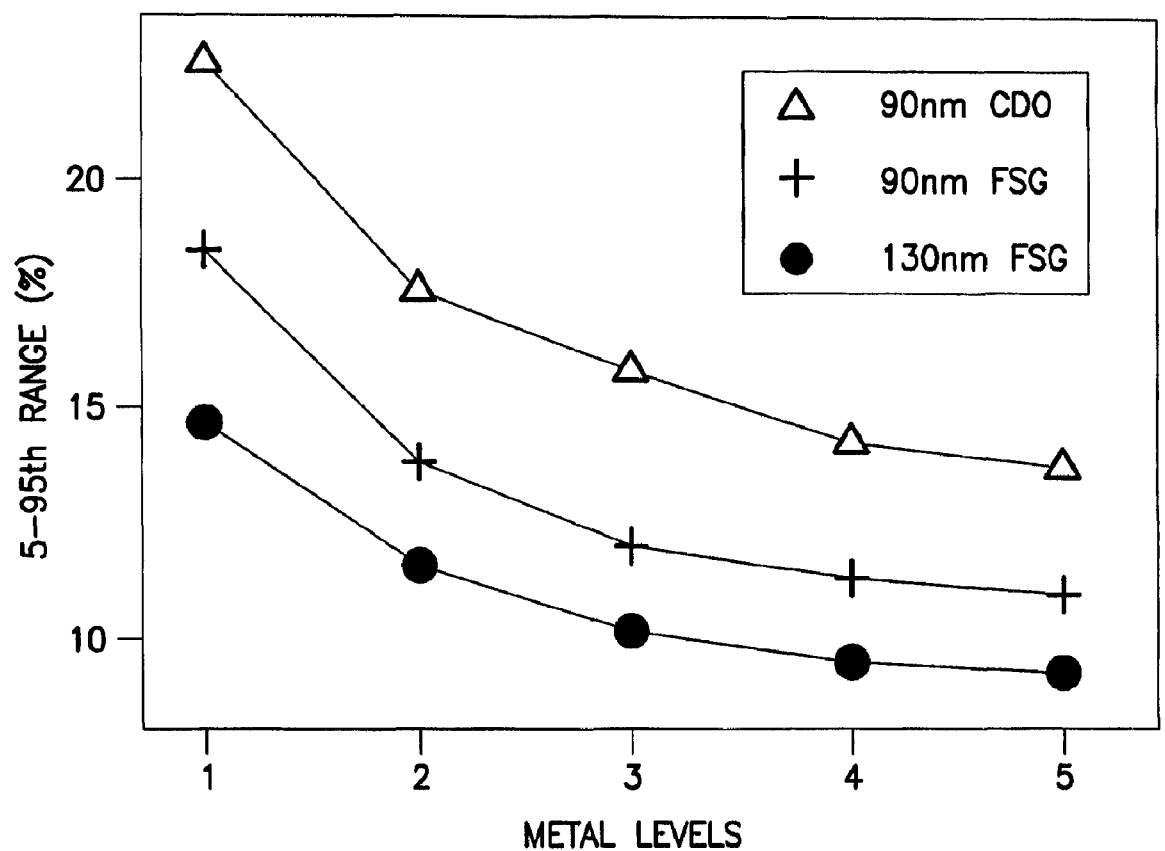
FIG. 8 shows a graph indicating the relationship between variability and the number of levels.

FIG. 8 shows the effect on variability, e,g, capacitance, of increasing number of metal levels, for various dimensions and intermetal dielectric materials complementing the data in Table I. The vertical axis is the electrically measured range between the $5^{th}$ and $95^{th}$ percentile of the parameter (capacitance) plotted against the number of metal levels. It is evident that the variability decreases as the number of levels of metal increases.

Figure 9B:
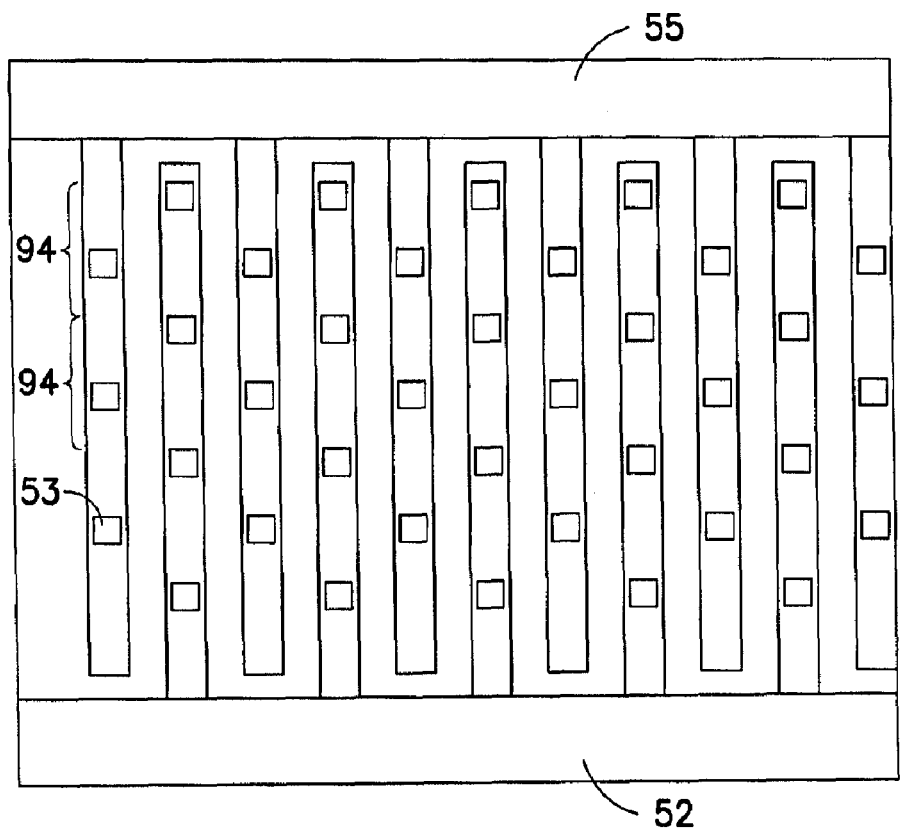

FIGS. 9A and 9B show detailed top views of the staggered—via VNC embodiment, in which the vias are staggered; i.e. the vias connecting the layers of electrode 52 are located on rows N and N+2, etc. while the vias connecting the layers of electrode 55 are located in between rows N and N+2, i.e. on row N+1, etc. This layout slightly reduces the contribution to the capacitance from the vias, but also reduces the risk of short circuits caused by misalignment of the connectors 53 relative to the solid fingers 52 and 55. For example, with 100 nm spaces between the wires and 140 nm wide wires, staggering the 100 nm wide vias with no reduction in via density decreases the capacitance by approximately 0.2% (FIG. 9a). If staggered vias are used with a 50% reduction in via density (i.e. the via spacing is increased from 100 nm to 300 nm), then the capacitance is decreased by approximately 1% (FIG. 9b). In both cases, the potential for via-induced shorting between wires is significantly reduced with a negligible decrease in capacitance.

FIG. 9A shows a top view of a capacitor similar to that of FIG. 6, but having staggered vertical electrodes connecting the different levels of the fingers 55-1 through 55-6 of electrode 55 and 52-1 through 52-5 of electrode 52. Brackets 92 in FIG. 9A denote a basic cell extending along a finger and having two vertical connectors in finger 55-1 and also two vertical connectors in finger 52-1 of the other electrode. Brackets 94 in FIG. 9B denote corresponding 2x cells having vertical connectors spaced by twice the amount as those in FIG. 9A. vertical connectors wires are spaced by a greater amount because the height of the connectors is increased. Illustratively, the fingers are 180 nm wide and the vertical connectors have borders of 20 nm.

In general, the wiring pitch (pitch=minimum wire width+ minimum wire space) is not constant for multilevel wiring. For the 65 nm generation, illustrative wiring pitches are given below, and the wire width and space are approximately ½ the pitch:

M1—160 nm
M2-M6—200 nm
M7-M8—400 nm
M9-M10—800 nm

When the wires are used to form resistors or capacitors, it is desirable to have a repeating unit cell. One method of achieving this is to use the M2-M6 wiring as a template, with the M1 wires having same width/space as M2; M7-M8 having double the pitch, and M9-M10 having quadruple the pitch: An example is shown in the following Table III

TABLE III

| Wire level | Min. wire width | Wire width | Wire space | Via width | Via border per edge |
|---|---|---|---|---|---|
| M1 | 80 nm | 140 nm | 100 nm | 100 nm | 20 nm |
| M2–M6 | 100 nm | 140 nm | 100 nm | 100 nm | 20 nm |
| M7–M8 | 200 nm | 280 nm | 200 nm | 200 nm | 40 nm |
| M9–M10 | 400 nm | 560 nm | 400 nm | 400 nm | 80 nm |

Although, in this example, a simple wire pitch doubling algorithm is used, any algorithm which results in a repeating unit cell could be used. FIGS. 9A and 9B show one example, with FIG. 9A showing the template level (M2 in the table above) and FIG. 9B showing a 2x spacing (M7 in the table above).

As with any wiring structures, it is desirable to minimize wire to wire or via to wire/via shorting both during processing and while the chip is in the field. For large minimum space structures, such as the capacitors or resistors discussed in this disclosure, a reaction between the dielectric and non-inert atmosphere (e.g. humid air) can occur, resulting in either the growth of Cu containing particles between wires or the degradation of the electrical insulative properties of the intermetal dielectric due to water absorption. To prevent this ambient atmosphere-induced degradation, particularly for FSG and carbon-based oxide (SiCOH) intermetal dielectrics (IMD), the time between Cu CMP and the post CMP dielectric cap deposition should be minimized and kept below a time window threshold amount. In particular, for FSG-IMD, the time window should be less than 16 hours, e.g. 6 hours; and, for SiCOH-IMD, the time window should be less than 120 hours, e.g. 24 hours. This allows for flexibility in manufacturing without degradation of the VNC yield or reliability, as determined by voltage ramp to fail or TDDB stressing. For films sensitive to water absorption, a bake-out, e.g. 400 C in a vacuum or inert ambient for 1 hour, rework step could be employed for wafers which exceed the time window.

The following claims refer to the first and second wiring levels. It will be evident to those skilled in the art that the first wiring level of a structure may be on the second, third, etc metal wiring level of the back end.

The disclosure has used a dual damascene technique for illustration, as this technique is economical. The invention can also be practiced with separate steps for the interconnections and for the vias While the invention has been described in terms of a single preferred embodiment, those skilled in the art will recognize that the invention can be practiced in various versions within the spirit and scope of the following claims.

What is claimed is:

1. A structure comprising:
    a substrate having at least two wiring levels containing interconnect members formed thereon;
    a passive circuit element formed in said at least two wiring levels having a first portion formed on a first wiring level simultaneously with interconnect members formed on said first wiring level and a second portion formed on a second wiring level simultaneously with interconnect members formed on said second wiring level, further comprising:
    a capacitor comprising at least two sets of interdigitated electrodes formed in each of said first and second wiring levels, each of said interdigitated electrodes being connected vertically to corresponding electrodes in the other of said first and second wiring levels by a set of vertical connection members, thereby forming an effective vertical plate, in which said vertical connection members are arrayed in rows disposed along said finger electrodes, with vertical connection members connecting finger electrodes of each of said interdigitated electrodes located in each of said first and second wiring levels, in which said vertical connection members are disposed in staggered rows disposed along said finger electrodes, with a row of vertical connection members connecting finger electrodes of one of said interdigitated electrodes alternating with a row of vertical connection members connecting finger electrodes of the other of said interdigitated electrodes;
    said finger electrodes have a finger width greater than the width of said vertical connection members; and
    in which at least one of said first and second wiring levels has vertical connection members arrayed in a set of unit cells having a first pitch and at least one other of said first and second wiring levels has vertical connection members arrayed in a set of unit cells having a second pitch greater than said first pitch.

2. A structure according to claim 1, in which said vertical connection members and said finger electrodes are formed in a dual damascene process.

3. A structure according to claim 1, in which said vertical connection members have a border, thereby having a width greater than a minimum linewidth and less than or equal to said finger width minus twice the magnitude of said border.

4. A structure according to claim 1, in which said second pitch is twice said first pitch.

5. A structure comprising:
a substrate having at least two wiring levels containing interconnect members formed thereon;
a passive circuit element formed in said at least two wiring levels having a first portion formed on a first wiring level simultaneously with interconnect members formed on said first wiring level and a second portion formed on a second wiring level simultaneously with interconnect members formed on said second wiring level, further comprising:
a capacitor comprising at least two sets of interdigitated electrodes formed in each of said first and second wiring levels, each of said interdigitated electrodes being connected vertically to corresponding electrodes in the other of said first and second wiring levels by a set of vertical connection members, thereby forming an effective vertical plate, in which said vertical connection members are arrayed in rows disposed along finger electrodes of each of said interdigitated electrodes, with vertical connection members connecting said finger electrodes of each of said interdigitated electrodes located in each of said first and second wiring levels, wherein said vertical connection members are disposed in staggered rows which are perpendicular to said rows disposed along said finger electrodes, with a staggered row of vertical connection members connecting finger electrodes of one of said interdigitated electrodes alternating with a staggered row of vertical connection members connecting finger electrodes of the other of said interdigitated electrodes; and,
said finger electrodes have a finger width greater than the width of said vertical connection members.

6. A structure according to claim 5, in which said vertical connection members and said finger electrodes are formed in a dual damascene process.

7. A structure according to claim 5, in which said vertical connection members have a border, thereby having a width greater than a minimum linewidth and less than or equal to said finger width minus twice the magnitude of said border.

* * * * *